United States Patent [19]

Lewis et al.

[11] Patent Number: 5,002,852
[45] Date of Patent: Mar. 26, 1991

[54] RECORDING MEDIUM OF IMPROVED STABILITY

[75] Inventors: David F. Lewis, Monroe, Conn.; Mark L. Moskowitz, Sarasota, Fla.; Steward E. Purdy, Binghamton, N.Y.

[73] Assignee: GAF Chemicals Corporation, Wayne, N.J.

[21] Appl. No.: 232,838
[22] PCT Filed: Dec. 8, 1987
[86] PCT No.: PCT/US87/03262
§ 371 Date: Jun. 20, 1988
§ 102(e) Date: Jun. 20, 1988
[87] PCT Pub. No.: WO88/04792
PCT Pub. Date: Jun. 30, 1988

Related U.S. Application Data

[63] Continuation-in-part of Ser. No. 130,267, Dec. 8, 1987, Pat. No. 4,784,934.

[51] Int. Cl.[5] .............................................. G03C 1/72
[52] U.S. Cl. .................................... 430/270; 430/296; 430/327; 430/905; 430/906; 427/385.5; 428/411.1
[58] Field of Search ............... 430/270, 296, 327, 905, 430/906; 427/385.5; 428/411.1

[56] References Cited

U.S. PATENT DOCUMENTS 3,844,791 10/1974 Bloom ................................. 430/336
4,734,355 3/1988 Lewis ................................. 430/270

Primary Examiner—C. Warren Ivy
Attorney, Agent, or Firm—Marilyn J. Maue; Joshua J. Ward

[57] ABSTRACT

The invention relates to a polyacetylenic recording film of improved resistance to degradation by UV light and increased sensitivity to ionizing radiation and to the process for producing said film which comprises dissolving polyacetylenic imaging crystals in n-butanol before forming a dispersion in a binder material and before coating on a polyester film base.

14 Claims, No Drawings

RECORDING MEDIUM OF IMPROVED STABILITY

This application is a continuation-in-part of our copending patent application Ser. No. 130,267, filed Dec. 8, 1987, now U.S. Pat. No. 4,784,934.

In one aspect this invention relates to a processless recording media comprising polyacetylenic crystals having improved properties.

In another aspect the invention relates to a process for preparing an imageable polyacetylenic solution prior to dispersion in a binder and coating on a film base for imaging by ionizing radiation.

BACKGROUND OF THE INVENTION

It is known that imaging layers suitable for coating on a substrate are prepared by dispersing a solution of an imageable polyacetylenic compound in a binder material and coating such dispersions on a polyester film base. In normal use, the unexposed portion of the film is not removed and is subject to development by prolonged exposure to visible light. For example, several weeks of exposure to the lighting intensity of a normal office environment or daylight can cause the background or unexposed portions of the imageable layer to turn blue. Such exposure to visible light causes degradation of the transmitted pattern by diminishing contrast between the imaged and background, or non-imaged, portions of the film.

Because the crystal size of commercially available, normally crystalline polyacetylenic compounds is often relatively large and of varying dimension and since for imageable coatings, a microcrystalline size between about 0.01 and about 5 micrometers is desirable, the commercial polyacetylenic compound is usually dissolved in a solvent from which it can be subsequently recrystallized as fine discrete crystals of more uniform microcrystalline size. An ester such as ethyl acetate is generally selected for forming the solution of the polyacetylenic compound which is subsequently dispersed as crystals in an aqueous binder solution suitable for coating on a film base. However, films prepared by this method lack the desired resistance to visible light radiation.

Accordingly, it is an object of this invention to overcome the above disadvantages by a process which is economical and commercially feasible.

Another object of this invention is to prepare an imageable polyacetylenic dispersion of improved stability with respect to visible radiation.

Another object is to provide an imageable polyacetylenic dispersion of increased sensitivity to ionizing radiation.

These and other objects of this invention will become apparent from the following description and disclosure.

THE INVENTION

According to this invention an imageable, normally crystalline polyacetylenic compound is dissolved in n-butanol to provide a solution containing a weight ratio of polyacetylene to alcohol of between about 4:1 and about 0.1:1; preferably between about 2:1 and about 1:2. To assure complete solution, the crystalline polyacetylene is desirably added with agitation over a period of from about 30 to about 90 minutes at a temperature of between about 20° C. and about 75° C. depending upon the polyacetylene selected. The resulting solution is then optionally filtered to remove any undissolved crystals. Preferred conditions for solubilizing the crystalline polyacetylenic compound include a temperature of from about 45° C. to about 60° C. under atmospheric pressure followed by filtration.

The n-butanol solvent of this invention employed for dissolution of the present polyacetylenic compounds is unique in its ability to increase resistance of polyacetylenic crystals to light exposure while providing clear, colorless dispersions when added to an aqueous binder solution. Tests with secondary butanol and many other solvents have failed to provide this improvement Additionally n-butanol possesses the ideal degree of water miscibility (9 cc in 100 g. $H_2O$ at 15° C.), solubilizing properties to give fine particle uniform dispersions of the polyacetylenes, a boiling point which permits easy separation from the polyacetylene dispersions and facility in transferring the polyacetylene from solution into the aqueous binder solution. Lower alcohols are too soluble in water to provide easy separation from aqueous gelatin. On the other hand, the higher alcohols such as hexanol, heptanol, etc. are water immiscible which hinders transferance of the polyacetylene molecules into the aqueous binder solution.

The n-butanol solvent of this invention can be employed in between about 95 and about 100 wt. % concentration, the higher alcohol concentrations being preferred.

The polyacetylenic compounds of the present invention are normally crystalline at ambient temperature and are preferably conjugated diynes, most preferably hydrocarbon, acid diynes or amido derivatives thereof containing from 20 to 30 carbon atoms. A general formula for these preferred acetylenic compounds is represented by the structure $A-(CH_2)_n-C\equiv C-C\equiv C-(CH_2)_m-B$ wherein m and n are both independently an integer of from 6 to 14 and A and B are independently methyl, carboxyl, amido or alkyl substituted amido groups. Specific examples of such polyacetylenes include pentacosa-10,12-diynoic acid; 13,15-octacosadiyne; N-(dimethyl)-10,12-pentacosadiynamide; N,N'-bis($\alpha$-methylbenzyl)-10,12-pentacosadiyndiamide and docosa-10,12-diyne-1,22-dioic acid. Of these, pentacosa-10,12-diynoic acid is most preferred since it provides unusually high sensitivity to electron beam exposure. It is to be understood however, that other normally crystalline, color developing polyacetylenes having a conjugated structure can be employed alone or in admixture with the preferred diynes as the image receptive layer of the present invention, such as the amino salts of polyacetylenes disclosed in U.S. Pat. No. 4,066,676, particularly the hexyl ammonium and propylammonium compounds in column 3 of said patent. Other suitable compounds include the diynes of the above structure wherein the A and/or B moieties, in addition to lower alkyl, amido or carboxyl, also can be hydroxy, substituted alkyl amido, an aliphatic or aromatic carboxylate ester group having up to 10 carbon atoms, a mono- or di- valent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolyl-urethane), 10,12-pentacosadiyne {[(butoxyl-carbonyl)methy]urethane} etc. The polyacetylenic compounds of this invention are employed in microcrystalline form usually having an average particle size between about 0.01 and about 5 micrometers, preferably between about 0.05 and about 0.2 micrometers.

The dissolved crystals are then dispersed in a non-solvating liquid binder preferably an aqueous solution of plastic, resin, colloid or gel, most preferably an aqueous gelatin solution. The binder component is generally prepared as a 0.1 to 50% aqueous solution which contains a small amount e.g. 0.001 to 5 wt. % of dispersing aid. The alcoholic polyacetylene solution is added to the binder solution with agitation at an elevated temperature to form a uniform liquid dispersion containing from about 2% to about 50%, preferably from about 4% to about 20% by weight solids. The binder solution is maintained at a temperature of from about 40° C. to about 100° C. during addition of the polyacetylene to assure liquid phase conditions. Generally, the addition and mixing of polyacetylene solution into the binder takes place over a period of from about 2 to 20 minutes. The polyacetylenic compound is transported from solution into the binder as dispersed crystals in emulsified form. Ratios of polyacetylene to binder of from about 10:1 to about 1:10 can be employed.

Exemplary binder materials include natural and synthetic plastics, resins, waxes, colloids, gels and the like including gelatins, desirably photographic-grade gelatin, various polysaccharides including dextran, dextrin, hydrophilic cellulose ethers and esters, acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methylacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl acetals including polyvinyl acetaldehyde acetal, polyvinyl butyraldehyde acetal, polyvinyl-sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the photosensitive polyacetylenic composition and then capable of processing to a solid form containing dispersed crystals of the photosensitive crystalline polyacetylenic composition of matter. As is well known in the art in the preparation of smooth uniform continuous coatings of binder materials, there may be employed therewith small amounts of conventional coating aids as viscosity controlling agents, surface active agents, leveling agents, dispersing agents, and the like. The particular binder material employed is selected with due regard to the specific radiant energy and technique to be employed in the particular image-recording application and invariably is a binder material permitting substantial transmission or penetration of that specific radiant energy to be employed After the addition of polyacetylene in alcohol to the binder solution is completed, the resulting emulsion is chilled to set the crystals at a temperature of from about 20° to about 2° C. and then shredded into small particles, e.g. 0.1–2 cm cubes. The particles are warmed to room temperature and alcohol solvent is evaporated, after which the dispersion is optionally subjected to the aging process described in copending application Ser. No. 941,885 [supra] for further increasing film sensitivity. More specifically the dispersion is aged by storing the dispersion at a temperature of from about 0° C. to about 12° C. for 1 to 30 days or by freezing the dispersion at a temperature of from about −78° C. to about −1° C. for 1 to 75 hours or by a combination of these ageing treatments.

The dispersion formed above can be employed for coating or it can be melted and reconstituted with water to approximately the volume before solvent evaporation.

The dispersion is coated on a suitable conductive substrate to a thickness of from about 0.25 to about 500 micrometers, preferably from about 1 to about 10 micrometers. Upon drying of the coated film, the polyacetylene crystals become fixedly positioned in the binder surface layer.

For the purposes of the present invention, it is preferred to employ a multi-layered base as the film substrate. When such a film is employed in a charged particle beam writing system, it essentially contains a separate conductive layer underlying the polyacetylene imaging layer consisting of polyacetylene crystals in a binder, and may also contain separate support and adhesive layers. However, in certain applications, where the polyacetylene binder has sufficient integrity at exposure temperatures, the imaging film may consist solely of crystals suspended in the binder which forms a single layer base film as the imaging medium. Such imaging films can be employed when the imaging energy source is other than a charged particle beam; in which cases, the need for a conductive layer is eliminated.

A typical film for the purpose of the present invention comprises microcrystalline polyacetylene in a non-solvating binder forming a layer of from about 0.25 to about 500 micrometers, preferably from about 1 to about 10 micrometers thickness, which overlays a substrate of from about 1 to about 10 mils thickness.

Imaging media suitable for the purposes of the present invention are any of those commercially available and generally include an electrically conductive layer of between about 1Å and about 0.25 micrometers thickness, preferably from about 100Å to about 0.05 micrometers thickness. Although transparent conductive layers of up to about 0.05 micrometers are most preferred, opaque conductive layers of up to 5 micrometers can also be employed when need arises. The conductive layer limits the capacitance of the charge accepting layer, namely the image-receptive polyacetylenic crystals dispersed in binder, and typically has a resistivity of $10^6$ ohms/square or less. The conductive material is an electrically conductive metal, metal oxide, metal alloy, metal halide or carbon black which metal, metal compound and carbon black components may or may not be suspended in a dispersion medium such as gelatin, dextran, a cellulose ether or ester or any other conventional suspension medium. Suitable metals include gold, silver, platinum, copper, iron, tin, aluminum, indium, nickel, palladium, rhodium and mixtures of these as may occur in alloys and metal oxides or halides. A specific mixed metal oxide which may be suitably employed includes indium-tin oxide Silver bromide and copper iodide are representative of the metal halides which may be used as the conductive layer. Of these conductive materials, indium-tin oxide is most preferred.

The conductive layer is usually supported by a substrate of between about 0.25 and about 100 mils, preferably 0.5 to 10 mils, thickness. Suitable materials employed as substrates include polyester, polyethylene terephthalate, glass, clay-sized paper, fiberboard, metal sheeting, glazed ceramic, cellulose acetate, polystyrene, polycarbonates or any other conventional support.

The substrate or support can be flexible or rigid, opaque or transparent depending on the final use of the film. Particularly preferred are the commercial polyester substrates such as MYLAR (polyethylene terephthalate), supplied by E. I. duPont Corporation and HOSTAPAN supplied by American Hoechst.

The image-receptive layer generally overlays a supported conductive layer, and in certain cases is more firmly affixed thereto by means of a thin adhesive layer having a thickness of between 1 and 1.5 micrometer. When used, suitable adhesives include acrylate based polymers and copolymers, particularly those containing carboxylate moieties such as acrylic acid or methacrylic acid residues and mixtures of these polymers or copolymers with gelatin.

In certain cases, when a conductive metal sheet is employed as the substrate, a separate conductive layer may be eliminated and the image-receptive layer disposed directly on the metal sheet conductive support.

The ionizing radiation energy contemplated as the energy source in the present invention includes energy generated from an electron beam such as developed by cathode ray guns, gamma rays and X-rays used in radiography, beta rays, electron corona discharge, ultraviolet light, actinic radiation from visible and infra-red regions of the electromagnetic spectrum and other forms of corpuscular and/or wave-like energy generally deemed to be radiant energy. For radiographic and short wave UV exposure, the conductive layer in the above dielectric film may be eliminated and the image-receptive crystals in the binder may be disposed directly on the substrate material; although absence of the conductive layer may permit the film to become so charged that a beam of electrons or ions employed for imaging may be somewhat distorted.

The preferred source of energy employed in the present invention is the electron beam. Generally the electrons, under high vacuum, between about $10^{-3}$ and about $10^{-9}$ torr, preferably between about $10^{-5}$ and about $10^{-8}$ torr, bombard the surface of the film, thus transmitting an image thereon for development into an optical display. The techniques of electron beam recording are well known, thus further amplification is not required. However, for illustrative purposes, a typical electron beam recording operation suitable for the present invention may utilize an electron beam characterized by having a beam diameter of from about 1 ro 25 micrometers, an energy of from about 10 to 30 KeV, a current flow of from about $10^{-9}$ to $10^{-6}$ amps and adapted to scan a target area at a rate such that the dwell time is from about $10^{-3}$ to $10^{-8}$ seconds. Vacuum pressures in the film chamber commonly range from $10^{-3}$ to $10^{-5}$ torr.

In one embodiment of the invention, pentacosa-10,12-diynoic acid crystals are dissolved in n-butanol to provide a 50% alcoholic solution. The solution is then added to a 50% aqueous solution of gelatin containing 1 wt. % of a surfactant with thorough mixing at an elevated temperature above the melting point of the gelatin binder and below the melting point of the polyacetylene. The resulting emulsion is chill set and cut into small particles after which n-butanol is evaporated and the polyacetylene crystals melted, reconstituted to original-volume with water to provide a suitable coating dispersion. The dispersion is applied to the surface of a base film and dried thereon at a temperature of from about ambient temperature up to about 100° C. but below the distortion temperature of the substrate or binder, and below the decomposition temperature or melting point of the polyacetylene compound. The drying operation is conducted over a period of from about 20 seconds to about 10 hours and is preferably effected at 15° to 60° C. for a period from about 1 minute to about 5 hours.

Upon exposure of the coated base film to the image transmitted from a source of ionizing radiation energy, the dried polyacetylene crystals, fixedly positioned in the binder, undergo a color change in the exposed areas to provide a replica of the transmitted image or pattern of the exposure in high resolution and contrast to the unexposed background. The color change can occur almost instantaneously or within a period of up to 2 days and the image is transmitted directly to the film without need for extraeneous development. By employing the ageing process of (Ser. No. 941,885), an image receiving layer of up to $6 \times 10^{-8}$ C/cm$^2$ and higher sensitivity, defined as the dosage of 20 KeV electrons required to produce a visual density of 2, can be obtained. Also, a maximum density greater than 4 can be achieved. After exposure of the imaged film to indoor office lighting for a period of 5 weeks, little development or darkening of the unimaged portion was noted and the light sensitivity of the film was reduced 4-fold as compared to a film prepared using ethyl acetate as the solvent for the diacetylenic imaging component.

Having thus described the invention, reference is now had to the following examples which illustrate preferred embodiments of the invention but which are not to be construed as limiting to its scope which is more broadly defined above and in the appended claims.

EXAMPLE 1

Dispersion Made With Ethyl Acetate Solvent

In a glass beaker, 372 g of pentacosa-10,12-diynoic acid was dissolved in 1120 g of ethyl acetate at 50° C. and filtered to form Solution A.

Solution B was prepared by separately dissolving 372 g of photographic gelatin in 6.5 liters of water containing 15 g of Alkanol-XC, a sodium alkyl naphthalene sulfonate dispersing aid.

After heating Solution B to 50° C., Solution A was added with vigorous agitation over a 2 minute period using a high shear mixer. An additional 2 minute agitation period followed, after which the dispersion was poured into stainless steel pans and chill set at 4° C. The dispersion was then shredded to about 1 cm cubes and placed in an air stream to evaporate substantially all the ethyl acetate. The shredded dispersion was then frozen at about $-15°$ C. for 2 days and then melted at 50° C. Water was added to the melt in an amount sufficient to replace the evaporated solvent.

After the addition of coating aid (Agent CD 188), the dispersion was coated by conventional methods to about 5 um thickness on a commercial 4-mil polyester film base having a transparent, conductive indium-tin oxide layer. This coating was labelled Coating A.

EXAMPLE 2

Dispersion Made With n-Butanol Solvent

In a glass beaker, solution C was prepared by dissolving 372 g of pentacosa-10,12-diynoic acid in 372 g of n-butanol at about 55° C. and filtering.

Solution D was made by separately dissolving 372 g of photographic gelatin in 6.5 liters of water containing 15 g of the dispersing aid Alkanol-XC.

After heating Solution D to 75° C. Solution C, at about 55° C., was added over a 2 minute period with vigorous stirring and thereafter stirring was continued for a further 2 minutes in a high shear mixer. The dispersion was then poured into stainless steel pans, chill set at 4° C. and shredded to about 1 cm cubes prior to standing in an air stream to remove substantially all the n-butanol by evaporation. The dispersion was then frozen at about $-15°$ C. for 48 hours at which time it was again melted at 50° C. and water was added to replace solvent lost by evaporation.

After the addition of the coating aid employed in Example 1, the dispersion was coated in a similar manner to about 5 um thickness on a commercial 4-mil polyester film base having a transparent indium-tin oxide layer This coating was labelled Coating B.

EXAMPLE 3

Electron Beam Exposure Sensitivity Of Coatings

Coatings A and B were each exposed to a 15 KeV electron beam at dosage leveLs between about $6 \times 10^{-9}$ C/cm$^2$ and $3 \times 10^{-6}$ C/cm$^2$ to provide sixteen 6 mm $\times$ 6 mm image areas having visual densities ranging from about 0.3 du to about 3.5 du. From these data, the dosages required to produce a visual density of 2.0 were calculated. The values were $0.8 \times 10^{-8}$ C/cm$^2$ and $0.7 \times 10^{-8}$ C/cm$^2$ for Coatings A and B respectively; thus establishing that Coating B has a greater electron sensitivity than Coating A.

EXAMPLE 4

Light Exposure Sensitivity Of Coatings

The electron beam exposed coatings from Example 3 were exposed to visible light from fluorescent light fixtures in an interior office environment for a period up to 56 days.

The densities of the imaged and unimaged areas on each sample were measured at time intervals, 0, 7 and 35 days. It was found that for Coating A, the densities of these imaged and unimaged areas increased uniformly by a set amount, regardless of the original density of the area, this was also observed for Coating B. However, it was found that the density on Coating A was increasing by about 0.03 du/week, while the increase for Coating B was 0.006 du/week; thus establishing that the light sensitivity of Coating B is much less than that of Coating A, despite the results of Example 3 which show that the electron beam sensitivity of Coating B is higher than that of Coating A. This anomaly was completely unexpected.

EXAMPLE 5

Dispersions made from pentacosa-10,12-diynoic acid solutions with various solvents in a 1:1 weight ratio were prepared and 5 micrometer coatings of these dispersions on a polyester film base were compared. These experiments were carried out by dissolving the polyacetylene in the 50 g of solvent contained in a glass beaker.

The resulting solution was gradually added at 75° C. to a Waring blender containing an aqueous solution of 5% gelatin and 0.2% sodium alkyl naphthalene sulfonate dispersing aid (ALKANOL-XC). The resulting emulsion was blended at high speed for 4 minutes at 75° C., then poured into a stainless steel pan, chill set and cut into 1 cm cubes. Solvent was then evaporated and the dispersion was reconstituted to its original volume with water. The reconstituted dispersion was stored for 2 hours at 30° C. and the resulting dispersion was then coated on a polyester film base to a thickness of 5 micrometers and the coatings compared. The results of these experiments are reported in the following Table.

TABLE

| Solvent | Appearance of Coating |
| --- | --- |
| iso-butanol | hazy |
| sec-butanol | turned blue |
| methanol | cloudy |
| dimethyl hexynol | hazy |
| n-butyl acetate | hazy, turned blue |
| n-butanol | clear |
| ethanol | hazy, turned blue |
| n-butanol/ethanol (50/50) | hazy, turned blue |
| octanol | hazy, turned blue |
| ethanol/sec-butanol (50/50) | hazy, turned blue |
| ethanol/ethyl acetate (50/50) | hazy, turned blue |
| n-propanol | turned blue |
| n-propanol/ethanol (50/50) | hazy |

The appearance of blue color indicated uncontrolled sensitivity or speed upon exposure to light.

It will be understood that many alterations and variations in Examples 1–5 can be made without departing from the scope of this invention. For example, any of the aforementioned imageable polyacetylenic compounds can be substituted therein for the pentacosa diynoic acid. Also, ageing of the shredded dispersion particles can be omitted or can be effected by storing the dispersion at a temperature of between about 0° C. and about 12° C. for a period of from about 1 to about 30 days or freezing said dispersion at a temperature of between about $-78°$ C. and about $-1°$ C. for a period of from about 1 to about 75 hours or a combination of the above described ageing techniques. In any case, ageing, when employed, must be effected prior to drying said dispersion on the substrate. These and many other modifications will become apparent to the skilled artisan.

What is claimed is:

1. A recording medium having reduced sensitivity to light and increased sensitivity to ionizing radiation which comprises a non-solvating binder having fixedly dispersed therein imageable, normally crystalline, conjugated polyacetylene microcrystals wherein said polyacetylene microcrystals are dispersed in said binder from solution in n-butanol, said solution containing a weight ratio of n-butyl alcohol to polyacetylene of between about 1:4 and about 1:0.1.

2. The recording medium of claim 1 wherein said dispersion is coated on a base film support.

3. The recording medium of claim 1 wherein said polyacetylene compound is pentacosa-10,12-diynoic acid 4. The process of preparing a dispersion of imageable, normally crystalline polyacetylenic microcrystals suitable for coating on a film base as a recording medium which comprises:
- (a) dissolving said imageable, normally crystalline polyacetylenic compound in n-butanol to provide a solution containing a weight ratio of between about 4:1 and about 0:1:1 polyacetylene to n-butanol;
- (b) under agitation, combining said solution with an aqueous binder solution containing between about 0.1 wt. % and about 50 wt. % of binder and between about 0.001 wt. % and about 5 wt. % of surfactant at an elevated temperature at which said binder is a liquid and below the melting point of said polyacetylene to produce an emulsion;
- (c) chilling the resulting mixture to produce a solid mass;
- (d) dividing said mass into particles having an average diameter not in excess of 5 cm; and;
- (e) evaporating said n-butanol from said particles at a temperature below the melting point of said polyacetylene to produce a dispersion product of said polyacetylene microcrystals uniformly and fixedly distributed in said binder.

5. The process of claim 4 wherein the dispersion product is melted at a temperature above the melting point of said binder and below the melting point of said polyacetylene and reconstituted with water to a volume at least equal to the amount of evaporated n-butanol.

6. The process of claim 4 wherein the dispersion product is coated on a film base to form an imaging layer.

7. The product of the process of claim 6.

8. The process of claim 5 wherein the dispersion product, after dilution with water, is coated on a film base to form an imaging layer.

9. The process of claim 4 wherein the emulsion is formed in a high shear mixer.

10. The process of claim 4 wherein the evaporation of n-butanol in step (e) is effected by air drying.

11. The process of claim 4 wherein the dispersion product is subjected to ageing at a temperature of between about −78° C. and about 12° C. for a period of from about 0.25 hour to about 30 days 12. The process of claim 5 wherein the dispersion product after dilution with water, is subjected to ageing at a temperature of between about −78° C. and about 12° C. for a period of from about 0.25 hour to about 30 days 13. The process of claim 11 wherein the aged product is coated and dried on a film base.

14. The process of claim 12 wherein the aged product is coated and dried on a film base.

* * * * *